United States Patent
Shimada

(10) Patent No.: US 6,292,502 B1
(45) Date of Patent: Sep. 18, 2001

(54) MULTIPLE QUANTUM WELL SEMICONDUCTOR LASER DIODE AND DVD SYSTEM USING THE SAME

(75) Inventor: Naohiro Shimada, Yokosuka (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/089,622

(22) Filed: Jun. 3, 1998

(30) Foreign Application Priority Data

Jun. 4, 1997 (JP) .................................................. 9-160696

(51) Int. Cl.[7] ...................................................... H01S 5/00
(52) U.S. Cl. .............................................. 372/45; 372/46
(58) Field of Search ............................ 372/43, 45, 46; 369/110

(56) References Cited

U.S. PATENT DOCUMENTS 4,429,378 * 1/1984 Sato ........................................ 369/110
5,299,216 * 3/1994 Van Der Poel et al. ............... 372/43
5,850,411 * 12/1998 Major, Jr. et al. ..................... 372/45

FOREIGN PATENT DOCUMENTS 6-196805 * 7/1994 (JP) .
8-181385 * 7/1996 (JP) .

OTHER PUBLICATIONS

Shimada, N., H. Matsuura, M. Watanabe, H. Okuda, K. Nitta, M. Okajima, "40mW Operation of InGaAlP Visible–Light Laser Diodes," 1993 ISOM/ODS'93 Conference Digest. pp. 170–171, (No Month Available).

* cited by examiner

Primary Examiner—Quyen P. Leung
(74) Attorney, Agent, or Firm—Hogan & Hartson, LLP

(57) ABSTRACT

An InGaAlP active region 3, which substantially lattice-matches with a GaAs substrate 1, has a multiple quantum well structure (MQW) formed by quantum well layers 11 of InGaP. When the oscillating wavelength caused by the current injection is less than or equal to 670 nm, the thickness (Lz) of the InGaP quantum well layers 11 is set to be less than 8 nm to form a lattice mismatching so that the quantum well layers 11 have a greater lattice constant than that of the GaAs substrate 1, and a compressive strain is added to the quantum well layers 11. Thus, gain is increased by reducing the thickness of the quantum well layers 11 and adding the compressive strain thereto, so that it is possible to achieve the improvement of the temperature characteristics, such as a reduced threshold, an improved efficiency, and a reduced current during operation at a high temperature, in a laser having an oscillating wavelength of 650 nm.

6 Claims, 7 Drawing Sheets

MULTIPLE QUANTUM WELL SEMICONDUCTOR LASER DIODE AND DVD SYSTEM USING THE SAME

BACKGROUND OF THE INVENTION

The present invention relates generally to a semiconductor laser device having an active region of a quantum well structure of an InGaP crystal, and a DVD system using the semiconductor laser.

Semiconductor laser devices have excellent characteristics, such as small size, steadiness, easiness of modulation, operability at a low voltage and a low current, and a long life in comparison with gas lasers and solid lasers. Therefore, semiconductor laser devices are not only substituted for gas lasers in fields which have been practically achieved, but there are often also application fields in which can be first practically achieved by semiconductor laser devices. As examples thereof, there are optical communication systems and optical information processing systems.

However, conventional semiconductor laser devices can not sufficiently clear specifications necessary for these application fields.

For example, a DVD system, such as a DVD-ROM (Digital Versatile Disc-Read Only Memory) and DVD-RAM(Random Access Memory), has been noticed as an optical information processing system capable of performing rapid access at a large capacity. It has been expected that a semiconductor laser device is used for a light source for an optical pickup head of the DVD systems.

However, according to the standard for light sources of the DVD systems, which has been standardized all over the world, it is required that the light sources have an oscillating wavelength of 650 nm, a very low threshold current, a high efficiency, stable temperature characteristics, a high maximum oscillating temperature (Tmax) and so forth.

On the other hand, a semiconductor laser device using an InGaAlP crystal, which lattice-matches with a GaAs substrate, practically has an oscillating waveband which is in the range of from 630 nm to 700 nm. In recent years, semiconductor laser devices using a quantum well structure, which uses an InGaP semiconductor layer having a thickness of a few nm as a well layer so that an active region has quantum effects, have been produced.

However, conventional semiconductor lasers having an oscillating wavelength of 650 nm have a high threshold current of about 60 mA and a low maximum oscillating temperature (Tmax) of about 80° C. For that reason, conventional semiconductor lasers do not meet the specifications of the DVD standard, so that it is required to much improve the characteristics of the semiconductor lasers.

SUMMARY OF THE INVENTION

It is therefore an object of the present invention to eliminate the aforementioned problems and to provide a semiconductor laser device having an MQW active region, which can greatly increase gain while maintaining a specific oscillating wavelength, such as 650 nm in the DVD standard, and which has a reduced threshold, an improved emission efficiency and improved temperature characteristics, such as a reduced current when operating at a high temperature. The semiconductor device of the present invention can be very suitably used as a light source for DVD systems or the like.

That is, according to the present invention, it is possible to much improve various characteristics, such as gain, while maintaining the required oscillating wavelength, by introducing a compressive strain into well layers while adjusting the thickness of the well layers.

In order to accomplish the aforementioned and other objects, according to one aspect of the present invention, a semiconductor laser device comprises: a GaAs substrate of a first conductive type; at least one $In_{0.5}(Ga_{1-x}Al_x)_{0.5}P$ cladding layer of the first conductive type, which is provided on a first principal plate of the GaAs substrate; a plurality of well layers provided on the cladding layer of the first conductive type; a plurality of $In_{0.5}(Ga_{1-y}Al_y)_{0.5}P$ barrier layers associated with the plurality of well layers for forming a multiple quantum well structure, each of the plurality of $In_{0.5}(Ga_{1-y}Al_y)_{0.5}P$ barrier layers being provided between adjacent well layers of the plurality of well layers; and at least one $In_{0.5}(Ga_{1-x}Al_x)_{0.5}P$ cladding layer of a second conductive type, which is provided on the multiple quantum well structure, wherein a compressive strain is introduced into the well layers.

With this construction, according to the present invention, it is possible to achieve a reduced threshold and improved temperature characteristics, such as a maximum oscillating temperature rise, by introducing a compressive strain into well layers of an active region having a MQW structure in a semiconductor laser which has an oscillating wavelength of 650±20 nm. In addition, the temperature characteristics can be improved by increasing the compressive strain in the well layers and introducing a tensile strain into guiding layers and/or barrier layers. Moreover, it is possible to achieve a more reduced threshold and a more improved temperature characteristics by providing two or more cladding layers.

The semiconductor laser device of the present invention can be very suitably used as a light source for DVD systems. According to the present invention, various kinds of DVD systems having high performance and high reliability can be actually put to practical use.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

First, the art, which is based on the development unique to the inventor and which serves as the basis of the present invention, will be described below.

A semiconductor laser having an oscillating wavelength of 650 nm, which was obtained by the inventor in the middle of the development of the present invention, had an MQW active region having a well width of 8 nm and a number of wells being 4. The transverse mode control of the semiconductor laser is carried out by a SBR (Selectively Buried Ridge) structure, which has a ridge-shaped stripe having a width of 5 μm.

Figure 7:
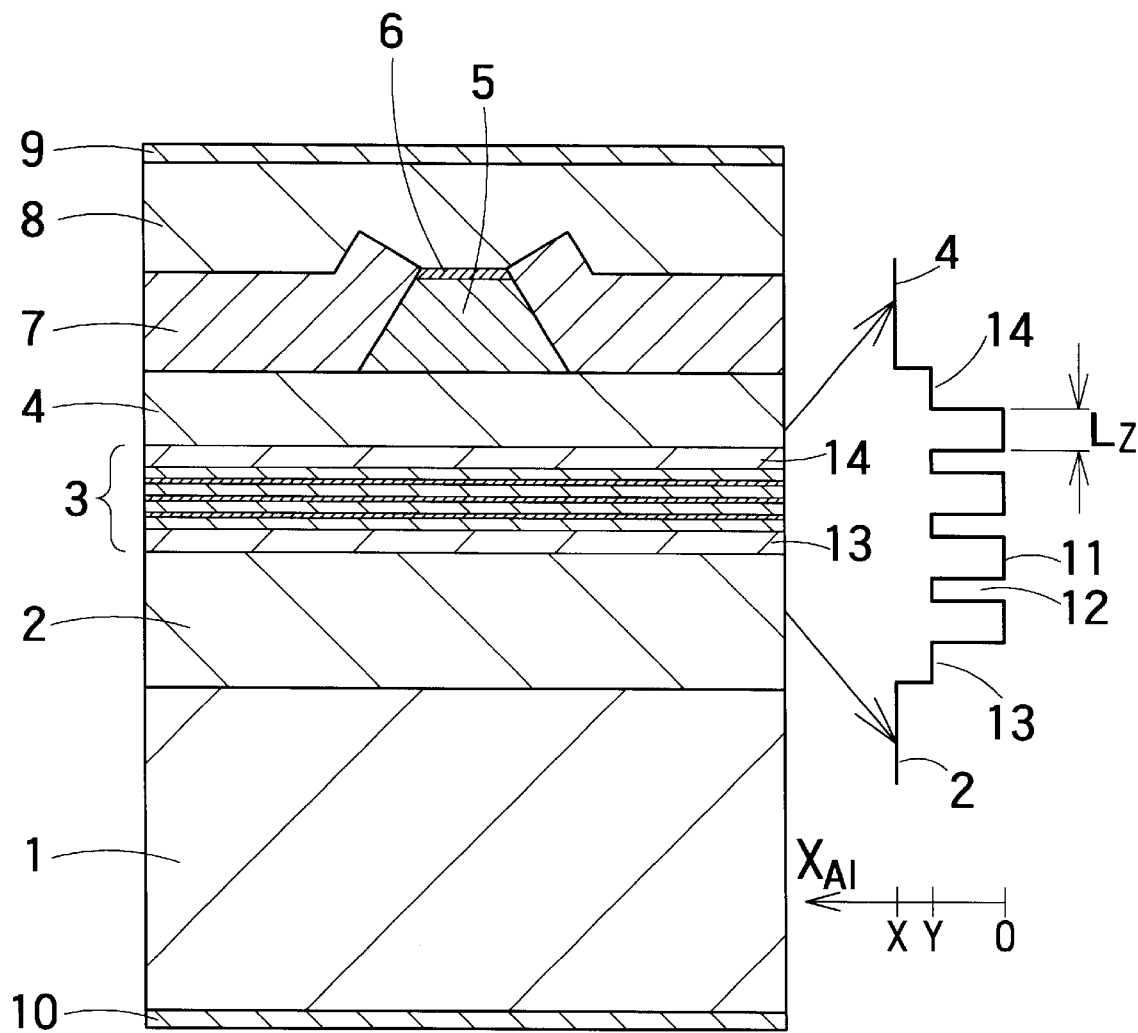
FIG. 7 is a view showing a section of a semiconductor laser device, which was obtained in the middle of the development unique to the inventor, and Al compositions of an active region thereof.

FIG. 7 is a sectional view of a semiconductor laser having a multiple quantum well (MQW). The semiconductor laser device of FIG. 7 will be briefly described below.

As a semiconductor substrate, a substrate of a first conductive type, e.g., an n-type GaAs substrate 1, is used. On a first principal plane of the GaAs substrate 1, at least one n-(n-type) $In_{0.5}(Ga_{1-x}Al_x)_{0.5}P$ cladding layer 2 is formed. On this n-type cladding layer 2, an active region 3 is formed. The active region 3 comprises first and second guiding layers, well layers sandwiched therebetween, and barrier layers provided between the well layers. That is, on the n-type cladding layer 2, at least one first $In_{0.5}(Ga_{1-y}Al_y)_{0.5}P$ guiding layer 13 is formed. On the first guiding layer 13, a plurality of InGaP well layers and a plurality of $In_{0.5}(Ga_{1-y}Al_y)_{0.5}P$ barrier layers 12 are alternately formed. On the well layer 11, at least one second $In_{0.5}(Ga_{1-y}Al_y)_{0.5}P$ guiding layer 14 is formed. On the second guiding layer 14, at least one cladding layer 4 of, e.g., a $p-In_{0.5}(Ga_{1-x}Al_x)_{0.5}P$, is formed. The well layers 11 have a thickness of about 8 nm. The Al composition ratios of the n-type and p-type cladding layers 2 and 4 are set to be greater than the Al compositions of the first and second guiding layers 13 and 14 (x>y).

On the p-type cladding layer 4, a striped ridge portion 5 of a $p-In_{0.5}(Ga_{1-u}Al_u)_{0.5}P$ cladding layer is formed. On the p-type cladding layer 4, current blocking layers 7 are formed so as to be arranged on both sides of the striped ridge portion 5. On the striped ridge portion 5, an intermediate band gap layer 6 is formed. On the intermediate band gap layer 6 and the current blocking layers 7, a p-type contact layer 8 is formed. A p-side electrode 9 serving as a first electrode is formed on the p-type contact layer 8, and an n-side electrode 10 serving as a second electrode is formed on a second principal plane of the n-GaAs substrate. An AuZn film or the like is formed on the p-side electrode 9, and an AuGe/Au film or the like is formed on the n-side electrode 10, by the vacuum deposition or the like.

These compound semiconductor layers are sequentially formed by the metal-organic chemical vapor deposition (MOCVD) or the like while changing conditions.

In the semiconductor laser of FIG. 7, the well layers are made of an InGaP which lattice-matches with the GaAs substrate, and the oscillating wavelength is controlled by utilizing the fact that energy level changes in accordance with the thickness of the well layers. When the thickness of the well layers decreases, the oscillating wavelength decreases. For example, in order to obtain a laser having an oscillating wavelength of 650 nm by means of a GaAs off substrate having a principal plane, which is inclined from (100) plane toward [001] by 5° or more, the thickness (Lz) of the wall layers may be about 8 nm.

However, the threshold current of the semiconductor laser of FIG. 7 was as high as 60 mA, and the maximum oscillating temperature (Tmax) was as low as 80° C.

The inventor achieved the improvement of gain by introducing strain into the well layers, and also achieved a reduced threshold current and an increased maximum oscillating temperature.

Referring now to the accompanying drawings, the preferred embodiments of the present invention will be described below.

First, referring to FIGS. 1 through 3, the first preferred embodiment of the present invention will be described. In this preferred embodiment, the well layers are made of an InGaP semiconductor having a thickness (Lz) of 4 nm, and the number of wells is 5. Although a part of the structure of the semiconductor laser device in this preferred embodiment is the same as that of the semiconductor laser device of FIG. 7 obtained in mid course of the development, the thickness of the well layers and the number of wells are different from those of the semiconductor laser device of FIG. 7. Moreover, a compressive strain of +1.3% is applied to the well layersin this preferred embodiment. Also at this point, the semiconductor laser device in this preferred embodiment is different from that of FIG. 7.

A semiconductor substrate 1 of a first conductive type may be, e.g., an n-type GaAs substrate. On a first principal plane of the n-GaAs substrate 1, at least one $n-In_{0.5}(Ga_{1-x}Al_x)_{0.5}P$ cladding layer 2 having a thickness of 1.2 μm is formed. On the n-type cladding layer 2, an undope MQW active region 3 is formed. The active region 3 comprises first and second guiding layers, well layers sandwiched therebetween, and barrier layers between the well layers. That is, on the n-type cladding layer 2, at least one first $In_{0.5}(Ga_{1-y}Al_y)_{0.5}P$ guiding layer 13 having a thickness of 30 nm is formed.

On the first guiding layer 13, InGaP well layers 11 having a thickness of 4 nm and a compressive strain of +1.3% are formed. On the well layers 11, $In_{0.5}(Ga_{1-y}Al_y)_{0.5}P$ barrier layers 12 having a thickness of 3.5 nm are formed. That is, five InGaP well layers 11 and four $In_{0.5}(Ga_{1-y}Al_y)_{0.5}P$ barrier layers 12 are alternately stacked. On the uppermost well layer 11, at least one second $In_{0.5}(Ga_{1-y}Al_y)_{0.5}P$ guiding layer 14 is formed. On the second guiding layer 14, at least one $p-In_{0.5}(Ga_{1-x}Al_x)_{0.5}P$ cladding layer 4, having a thickness of, e.g., 1.2 μm, is formed. The Al composition ratios of the n-type and p-type cladding layers 2 and 4 are set to be greater than the Al composition ratios of the first and second guiding layers 13 and 14 (x>y). For example, x=0.7 and y=0.5.

On the p-type cladding layer 4, a striped ridge portion 5 of a $p-In_{0.5}(Ga_{1-u}Al_u)_{0.5}P$ cladding layer is formed. On the p-type cladding layer 4, current blocking layers 7 are formed so as to be arranged on both sides of the striped ridge portion 5. On the striped ridge portion 5, an intermediate band gap layer 6 is formed. On the intermediate band gap layer 6 and the current blocking layers 7, a p-type contact layer 8 is formed. These stacked compound semiconductor layers are sequentially formed by, e.g., the metal-organic chemical vapor deposition (MOCVD) while changing conditions.

A p-side electrode 9 serving as a first electrode is formed on the p-type contact layer 8, and an n-side electrode 10 serving as a second electrode is formed on a second principal plane of the n-GaAs substrate. An AuZn film or the like is formed on the p-side electrode 9, and an AuGe/Au film or the like is formed on the n-side electrode 10, by the vacuum deposition or the like.

Figure 1:
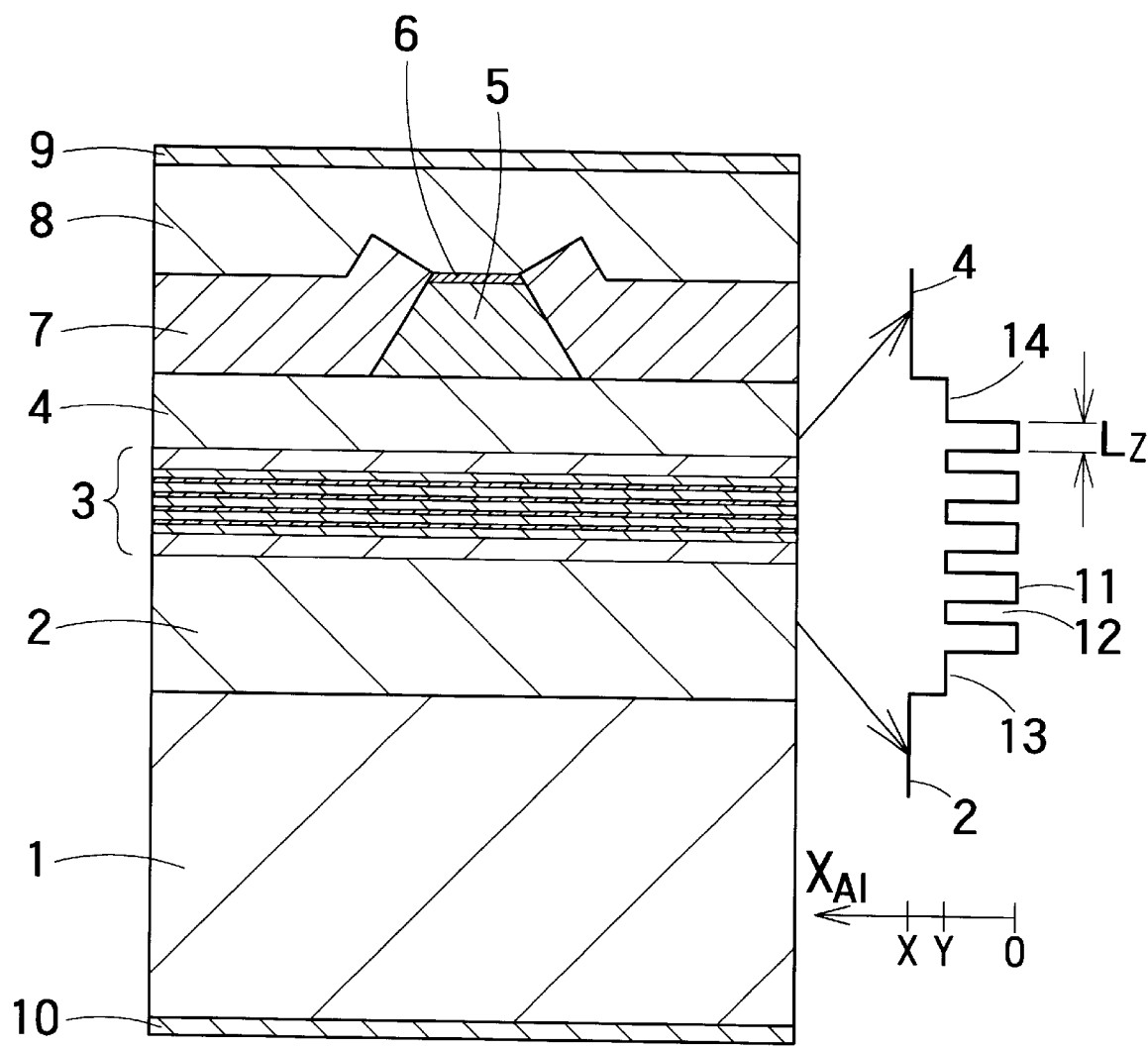
FIG. 1 is a view showing a section of a semiconductor laser device and Al compositions of an active region thereof.

FIG. 1 also shows the Al composition ratios of the respective layers of the active region 3. The abscissas indicates the Al composition ratios (XAl), and the origin indicates an Al composition ratio of 0. The potential increases in proportion to the Al composition ratio. That is, the relationship between the Al composition ratios also indicates the relationship between the potentials of the respective layers.

Figure 2:
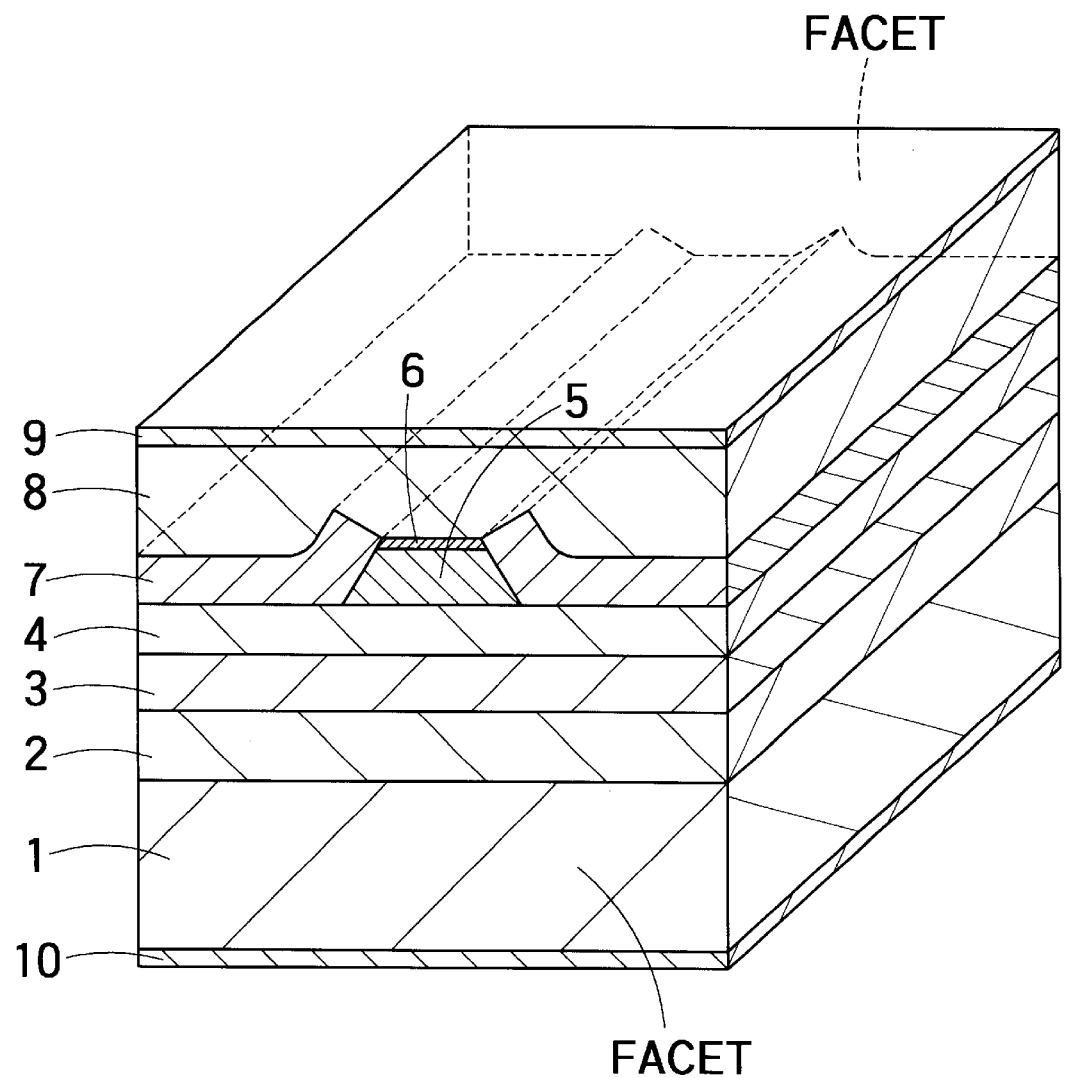
FIG. 2 is a perspective view of the semiconductor device of FIG. 1.

As shown in FIG. 2, a semiconductor chip obtained by the cleavage of the GaAs substrate 1 has a resonator. A pair of end faces (facets) formed on both ends of the stripe of the ridge portion 5 serve as the reflecting surfaces of the resonator. A laser light is emitted from this surface.

A process for producing the semiconductor laser device, particularly a process for forming the striped ridge portion 5, will be described in detail below.

First, after forming a p-type cladding layer 4, an intermediate band gap layer 6 of a p-InGaP having a thickness of 5 nm is caused to grow thereon. On the intermediate band gap layer 6, a patterned $SiO_2$ film (not shown) is formed. This is used as a mask to form a striped ridge portion 5 having a width of 5 μm by the PEP (Photo-Engraving Process) and the etching to the upper middle of the p-type cladding layer 4. Thereafter, the $SiO_2$ film is used as a mask to cause a current blocking layers 7 of GaAs to selectively grow on both sides of the striped ridge portion 5. Thereafter, the $SiO_2$ film used as the mask is peeled off to cause a p-GaAs contact layer 8 to grow on the striped ridge portion 5 and the current blocking layers 7. Then, after forming a p-side electrode and an n-side electrode, the cleavage of the GaAs substrate is carried out so that the resonator length is 600 μm. Thus, a plurality of semiconductor chips are formed.

The semiconductor laser device thus formed had a threshold current (Ith) of 45 mA and a maximum oscillating temperature (Tmax) of 90° C. while maintaining an oscillating wavelength 650 nm, and oscillated at a higher temperature than that of the semiconductor laser of FIG. 7. In addition, the semiconductor laser device thus formed had a low operating current of 85 mA at 70° C. in an optical output of 5 mW, and very high reliability. That it, it was possible to obtain a higher efficiency and more stable temperature characteristics than those of conventional semiconductor laser device while maintaining the oscillating wavelength to be 650 nm. The semiconductor laser device according to the present invention serves as a very excellent light source for DVD systems, so that DVD systems having high performance and high reliability can be realized.

Thus, the reason why the semiconductor laser device according to the present invention has very excellent characteristics in a waveband of 650 nm in comparison with conventional semiconductor laser devices is that strain is introduced into the well layers. That is, the band structure of the semiconductor can be shifted by introducing strain into the well layers. As a result, it is possible to improve gain as well as temperature characteristics.

While the compound semiconductor forming the well layers has been indicated by InGaP, it may be indicated by $In_wGa_{1-w}P$ in detail. According to the present invention, w is set to be greater than 0.5 and less than or equal to 0.67. When w=0.5, there is no strain, and when w>0.5, a compressive strain is applied. When the strain is too great to maintain the critical thickness of the crystal, so that w must be smaller than 0.67.

Figure 3:
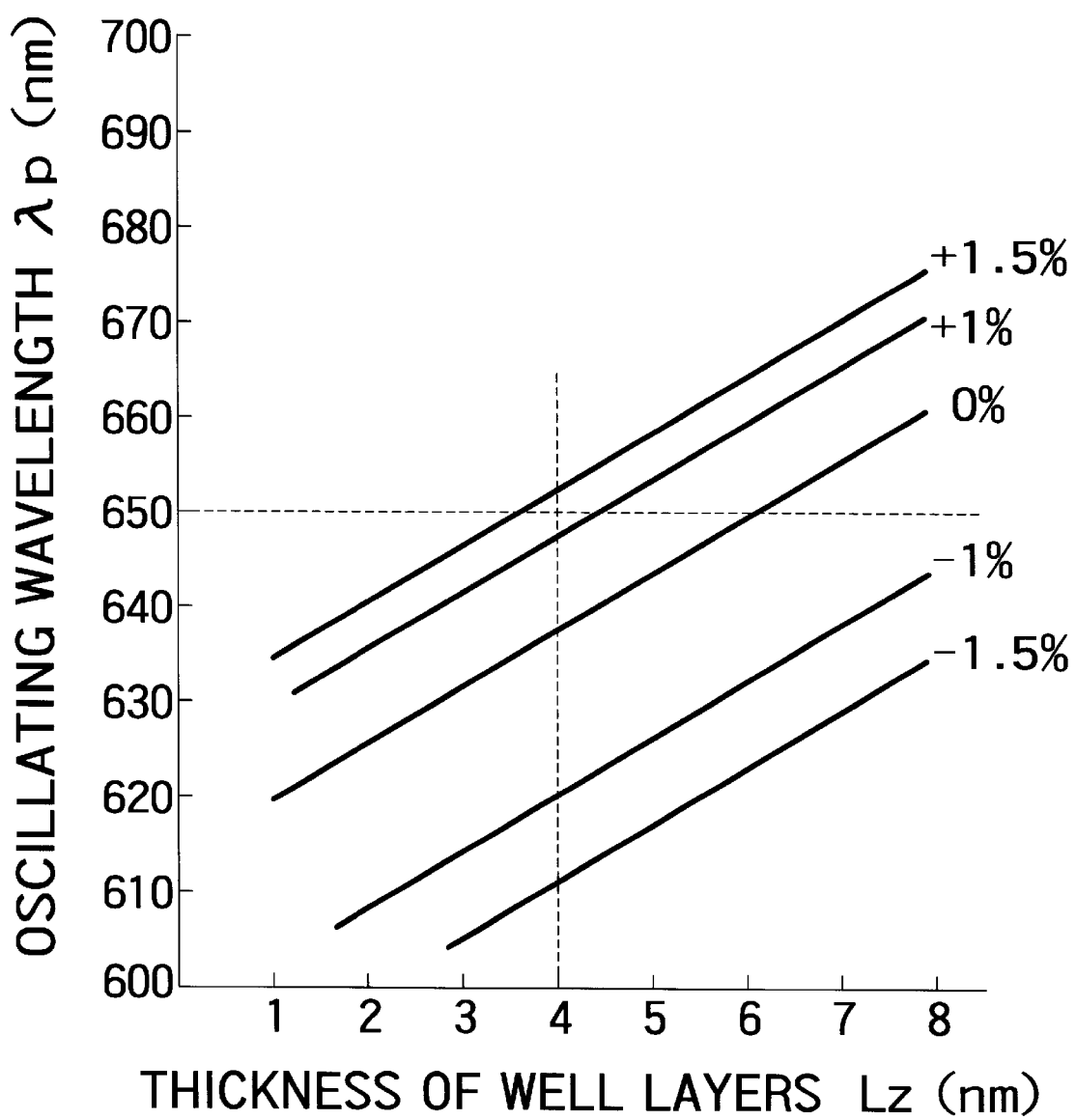
FIG. 3 is a characteristic diagram showing the relationship between the thickness of well layers and the oscillating wavelength of a semiconductor laser device, using strains as parameters.

FIG. 3 shows data obtained by the results of investigation unique to the inventor, which is a characteristic diagram showing the dependency of the oscillating wavelength (λp) of a semiconductor laser device having an MQW structure on the thickness (Lz) of well layers, i.e., the well width (Lz), and the dependency of λp-Lz characteristic on strain. The ordinate indicates the oscillating wavelength (λp) (nm), and the abscissa indicates the well width (Lz). This figure shows five λp-Lz characteristic lines. Each of the characteristic lines shows the emission characteristics of a semiconductor laser device, to which a strain of a shown value is applied. However, the λp-Lz characteristic line of 0% shows the emission characteristic of the semiconductor laser device which has well layers having no strain.

It can be seen from the λp-Lz characteristics that the well width (Lz) is in proportion to the oscillating wavelength (λp), and that when the well width (Lz) decreases, the oscillating wavelength (λp) also decreases. For example, it can be seen that in order to obtain an oscillating wavelength of 650 nm, which meets the DVD standard, by a semiconductor laser device having no strain (the characteristic line of 0% in FIG. 3), the well width (Lz) must be about 6.2 nm.

On the other hand, it can be seen that when compressive strains of +1% and +1.5% are applied to the well layers, the oscillating wavelength (λp) increases, and that when tensile strains of −1% and −1.5% are applied to the well layers, the oscillating wavelength (λp) decreases. In addition, it was found by the inventor's trial manufacture that the strain introduced into the well layers was preferably a compressive strain in comparison with a tensile strain.

According to the present invention, it is possible to achieve a reduced threshold, an improved efficiency and improved temperature characteristics, such as a reduced current during operation at a high temperature, by introducing the compressive strain into the well layers while maintaining the required oscillating wavelength. For example, it can be seen that in order to apply a compressive strain of +1.3% to the well layers while maintaining an oscillating wavelength (λp) of 650 nm as shown by the broken line in FIG. 3, the well width (Lz) must be about 4 nm.

This is very different from the thickness of the well layers of conventional semiconductor lasers having no strain (0%). That is, in the semiconductor laser device having no strain (the characteristic line of 0% in FIG. 3), when the well width (Lz) is set to be 4 nm, the oscillating wavelength (λp) is 635 nm. This is very different from the DVD standard.

That is, the semiconductor laser device of the present invention is characterized by a very unique combination of the amount of strain introduced into the well layers and the thickness thereof in order to improve various characteristics, such as gain, while maintaining the required oscillating wavelength.

The above described preferred embodiment is only an embodiment of the present invention. That is, according to the present invention, it is possible to much improve various characteristics, such as gain, while maintaining the required oscillating wavelength, by introducing a compressive strain into well layers forming a multiple quantum well structure and setting the thickness of the well layers to be thin. Therefore, it is possible to determine the amount of the introduced compressive strain and the thickness of the well layers on the basis of FIG. 3 in accordance with the specification of the required oscillating wavelength in various application fields.

The band of the oscillating wavelength required in many optical disc systems is a wavelength of 650±20 nm. It can be seen from FIG. 3 that the thickness of a well layer must be less than 8 nm in order to obtain a laser light of this band while introducing a compressive strain into the well layers.

In the case of the recordable systems such as the DVD-RAM, a high power laser is required to write data on a optical disc. To meet the requirement, the inventor found it preferable to increase the composition w of indium up to about 0.67. At that high composition, the compressive strain as high as +1.7% is introduced into the well layers. In order to prevent the deterioration of the crystal, it is preferable to reduce the number of well layers so that the total strain should be limited. The Inventor found that the total number of the well layers is preferably limited to 3 or 4. It is also possible to advantageously reduce the power density of the active region by limiting the number of the well layers, because the light distribution extends out from the active region by reducing the thickness of the active region.

According to the Inventor's experiment, one preferable exemplary device parameters for the high power lasers are as follows: the composition of indium being about 0.67, the compressive strain introduced into the well layers being about +1.7% and the number of the well layers being 3 or 4.

Figure 4:
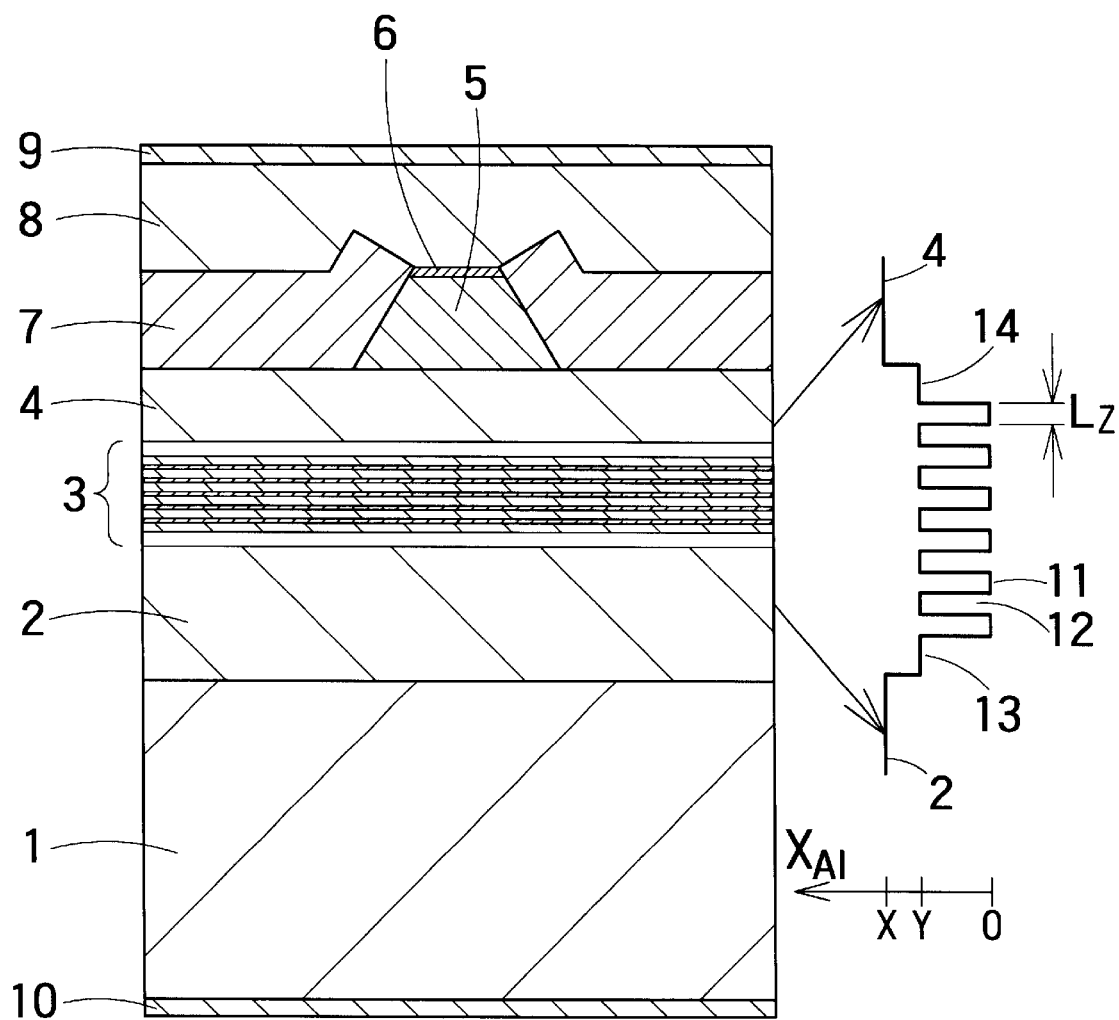
FIG. 4 is a view showing a section of a semiconductor laser device and Al compositions of an active region thereof.

Referring to FIG. 4, the second preferred embodiment of the present invention will be described below.

FIG. 4 shows a section of a semiconductor laser device having an MQW structure, and the Al composition ratios of the respective layers of an active region thereof. The respective Al composition ratios correspond to the potentials of the respective layers. The well layers are made of an InGaP semiconductor having a thickness (Lz) of 3.5 nm, and the number of wells is 6. Although a part of the structure of the semiconductor laser device in this preferred embodiment is the same as that of the semiconductor laser device of FIG. 7, the thickness of the well layers and the number of wells are different. In addition, a compressive strain of +1.5% is applied to the well layers, and a tensile strain of −0.4% is applied to at least one of guiding and barrier layers. Also at these points, the semiconductor laser device in this preferred embodiment is different from that of FIG. 7.

A semiconductor substrate 1 of a first conductive type may be, e.g., an n-type GaAs substrate. On a first principal plane of the n-GaAs substrate 1, at least one n-$In_{0.5}(Ga_{1-x}Al_x)_{0.5}P$ cladding layer 2 having a thickness of 1.2 μm is formed. On the n-type cladding layer 2, an undoped MQW active region 3 is formed. The active region 3 comprises first and second guiding layers, well layers sandwiched therebetween, and barrier layers between the well layers. That is, on the n-type cladding layer 2, at least one first $In_{0.5}(Ga_{1-y}Al_y)_{0.5}P$ guiding layer 13 having a thickness of 30 nm is formed.

On the first guiding layer 13, InGaP well layers 11 having a thickness of 3.5 nm and a compressive strain of +1.5% are formed. On the well layers 11, $In_{0.5}(Ga_{1-y}Al_y)_{0.5}P$ barrier layers 12 having a thickness of 3.0 nm are formed. That is, six InGaP well layers 11 and five $In_{0.5}(Ga_{1-y}Al_y)_{0.5}P$ barrier layers 12 are alternately stacked.

As described above, the tensile strain of −0.4% is introduced into the guide layers 13 and 14 and the barrier layers 12 so as to compensate the strain of the well layers 11. Because it is required to prevent a semiconductor crystal from being broken since the compressive strain applied to the well layers is too large to maintain the critical thickness of the crystal. That is, it is possible to compensate the compressive strain outside the well layers by introducing the tensile strain into the guiding and barrier layers.

On the uppermost well layer 11, at least one second $In_{0.5}(Ga_{1-y}Al_y)_{0.5}P$ guiding layer 14 is formed. On the second guiding layer 14, at least one p-$In_{0.5}(Ga_{1-x}Al_x)_{0.5}P$ cladding layer 4, having a thickness of, e.g., 1.2 μm, is formed. The Al composition ratios of the n-type and p-type cladding layers 2 and 4 are set to be greater than the Al composition ratios of the first and second guiding layers 13 and 14 (x>y). For example, x=0.7 and y=0.5.

On the p-type cladding layer 4, a striped ridge portion 5 of a p-$In_{0.5}(Ga_{1-u}Al_u)_{0.5}P$ cladding layer is formed. On the p-type cladding layer 4, current blocking layers 7 are formed so as to be arranged on both sides of the striped ridge portion 5. On the striped ridge portion 5, an intermediate band gap layer 6 is formed. On the intermediate band gap layer 6 and the current blocking layers 7, a p-type contact layer 8 is formed. These stacked compound semiconductor layers are sequentially formed by, e.g., the metal-organic chemical vapor deposition (MOCVD) while changing conditions.

A p-side electrode 9 serving as a first electrode is formed on the p-type contact layer 8, and an n-side electrode 10 serving as a second electrode is formed on a second principal plane of the n-GaAs substrate. An AuZn film or the like is formed on the p-side electrode 9, and an AuGe/Au film or the like is formed on the n-side electrode 10, by the vacuum deposition or the like.

FIG. 4 also shows the Al composition ratios of the respective layers of the active region 3. The abscissas indicates the Al composition ratios (XAl), and the origin indicates an Al composition ratio of 0. The potential increases in proportion to the Al composition ratio. That is, the relationship between the Al composition ratios also indicates the relationship between the potentials of the respective layers.

A process for producing the semiconductor laser device, particularly a process for forming the striped ridge portion 5, will be described in detail below.

First, after forming a p-type cladding layer 4, an intermediate band gap layer 6 of a p-InGaP having a thickness of 5 nm is caused to grow thereon. On the intermediate band gap layer 6, a patterned $SiO_2$ film (not shown) is formed. This is used as a mask to form a striped ridge portion 5 having a width of 5 μm by the PEP and the etching to the upper middle of the p-type cladding layer 4. Thereafter, the $SiO_2$ film is used as a mask to cause a current blocking layers 7 of GaAs to selectively grow on both sides of the striped ridge portion 5. Thereafter, the $SiO_2$ film used as the mask is peeled off to cause a p-GaAs contact layer 8 to grow on the striped ridge portion 5 and the current blocking layers 7. Then, after forming a p-side electrode and an n-side electrode, the cleavage of the GaAs substrate is carried out so that the resonator length is 600 μm. Thus, a plurality of semiconductor chips are formed.

While the compound semiconductor forming the well layers has been indicated by InGaP, it may be indicated by $In_wGa_{1-w}P$ in detail. According to the present invention, w is set to be greater than 0.5 and less than or equal to 0.67. When w=0.5, there is no strain, and when w>0.5, a compressive strain is applied. When the strain is too great to maintain the critical thickness of the crystal, so that w must be smaller than 0.67.

In this preferred embodiment, the semiconductor laser device oscillated at an oscillating wavelength (λp) of 653 nm, a threshold current (Ith) of 45 mA and a maximum oscillating temperature (Tmax) of 95° C. The operating current of the semiconductor laser device was low, about 85 mA at 80° C., 5 mW, and the reliability thereof was high. Thus, it is possible to compensate the compressive strain of the well layers outside the well layers to more improve the temperature characteristic of the semiconductor laser by introducing the tensile strain into the guiding and barrier layers.

Figure 5:
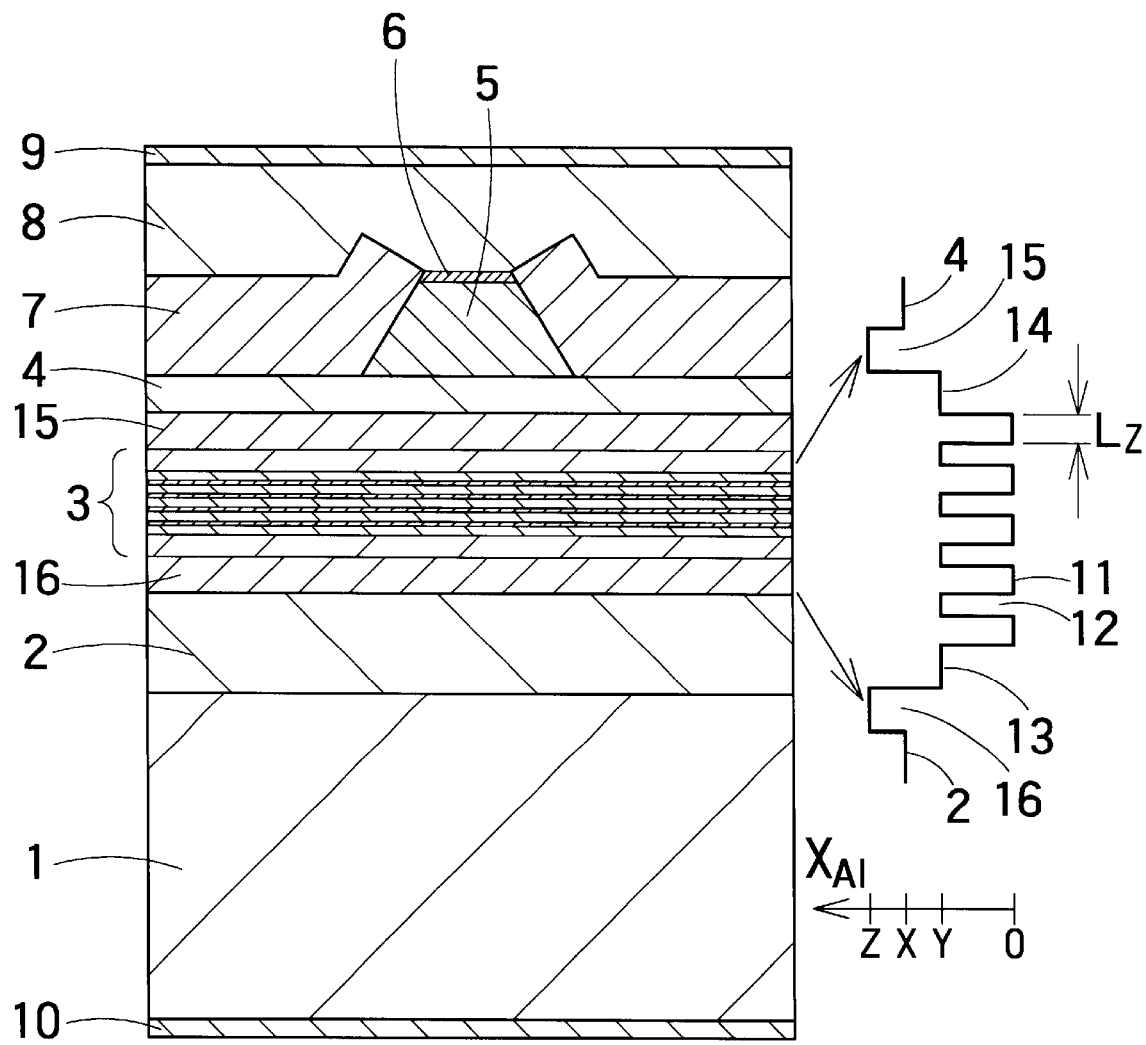
FIG. 5 is a view showing a section of a semiconductor laser device and Al compositions of an active region thereof.

Referring to FIG. 5, the third preferred embodiment of the present invention will be described below.

FIG. 5 is a view showing a section of a semiconductor laser device having an MQW structure and the Al compositions and potentials of the respective layers of an active region thereof. The well layers are made of an InGaP semiconductor having a thickness (Lz) of 4 nm, and the number of wells is 5. The structure of the semiconductor laser device in this preferred embodiment is substantially the same as that of the semiconductor laser device shown in FIG. 1, except that the number of cladding layers is different from that of FIG. 1.

On the first principal plane of an n-GaAs substrate 1, an n-$In_{0.5}(Ga_{1-x}Al_x)_{0.5}P$ cladding layer 2 having a thickness of 1.1 μm and an n-$In_{0.5}(Ga_{1-z}Al_z)_{0.5}P$ cladding layer 16 having a thickness of 0.1 μm are formed. On the n-type cladding layer 16, an undoped MQW active region 3 is formed. The active region 3 comprises first and second guiding layers, well layers sandwiched therebetween, and barrier layers between the well layers. That is, on the n-type cladding layer 16, at least one first $In_{0.5}(Ga_{1-y}Al_y)_{0.5}P$ guiding layer 13 having a thickness of 30 nm is formed.

On the first guiding layer 13, InGaP well layers 11 having a thickness of 4 nm and a compressive strain of +1.3% are formed. On the well layers 11, $In_{0.5}(Ga_{1-y}Al_y)_{0.5}P$ barrier layers 12 having a thickness of 3.5 nm are formed. That is, five InGaP well layers 11 and four $In_{0.5}(Ga_{1-y}Al_y)_{0.5}P$ barrier layers 12 are alternately stacked.

As described above, the tensile strain of −0.4% is introduced into the guide layers 13 and 14 and the barrier layers 12 so as to compensate the strain of the well layers 11. Because it is required to prevent a semiconductor crystal from being broken since the compressive strain applied to the well layers is too great to maintain the critical thickness of the crystal. That is, it is possible to compensate the compressive strain outside the well layers by introducing the tensile strain into the guiding and barrier layers.

On the uppermost well layer 11, at least one second $In_{0.5}(Ga_{1-y}Al_y)_{0.5}P$ guiding layer 14 is formed. On a second guiding layer 14, a p-$In_{0.5}(Ga_{1-z}Al_z)_{0.5}P$ cladding layer 15 and a p-$In_{0.5}(Ga_{1-x}Al_x)_{0.5}P$ cladding layer 4, each of which has a thickness of 0.1 μm, are formed. The Al composition ratios (x) of the n-type and p-type cladding layers 2 and 4 are set to be greater than the Al composition ratios (y) of the first and second guiding layers 13 and 14 (x>y). In addition, the Al composition ratios (z) of the cladding layers 15 and 16 are set to be greater than the Al composition ratios (x) of the cladding layers 2 and 4. For example, x=0.7, y=0.5, and z=1.0.

On the p-type cladding layer 4, a striped ridge portion 5 of a p-$In_{0.5}(Ga_{1-u}Al_u)_{0.5}P$ cladding layer is formed. On the p-type cladding layer 4, current blocking layers 7 are formed so as to be arranged on both sides of the striped ridge portion 5. On the striped ridge portion 5, an intermediate band gap layer 6 is formed. On the intermediate band gap layer 6 and the current blocking layers 7, a p-type contact layer 8 is formed. These stacked compound semiconductor layers are sequentially formed by, e.g., the metal-organic chemical vapor deposition (MOCVD) while changing conditions.

A p-side electrode 9 serving as a first electrode is formed on the p-type contact layer 8, and an n-side electrode 10 serving as a second electrode is formed on a second principal plane of the n-GaAs substrate. An AuZn film or the like is formed on the p-side electrode 9, and an AuGe/Au film or the like is formed on the n-side electrode 10, by the vacuum deposition or the like.

The cladding layers 15 and 16 have higher potentials than those of the cladding layers 2 and 4 to prevent the overflow of electrons from an active region 3. In general, the overflow of electrons remarkably occurs particularly at a high temperature to deteriorate emission characteristics. On the other hand, it is possible to suppress the overflow of electrons to more improve the temperature characteristics of the semiconductor laser device by providing the cladding layers 15 and 16.

While the compound semiconductor forming the well layers has been indicated by InGaP, it may be indicated by $In_wGa_{1-w}P$ in detail. According to the present invention, w is set to be greater than 0.5 and less than or equal to 0.67. When w=0.5, there is no strain, and when w>0.5, a compressive strain is applied. When the strain is too great to maintain the critical thickness of the crystal, so that w must be smaller than 0.67.

In this preferred embodiment, the semiconductor laser device oscillated at an oscillating wavelength (λp) of 650 nm, a threshold current (Ith) of 42 mA and a maximum oscillating temperature (Tmax) of 100° C. The semiconductor laser device had a low operating current of about 90 mA at 85° C., 5 mW, and the reliability thereof was high. Thus, according to this preferred embodiment, it is possible to suppress the overflow of electrons to more improve the temperature characteristics of the semiconductor laser device by providing the cladding layers 15 and 16.

In particular, according to this preferred embodiment, the threshold current can be remarkably decreased, and the temperature characteristics can be remarkably improved (i.e. the semiconductor laser device can operate at a high temperature of higher than or equal to 85° C.). Therefore, the semiconductor laser device in this preferred embodiment can be most suitably used as, e.g., a light source for DVD-ROM systems mounted on automotive vehicles, which must meet particularly severe specifications with respect to temperature characteristics.

Figure 6:
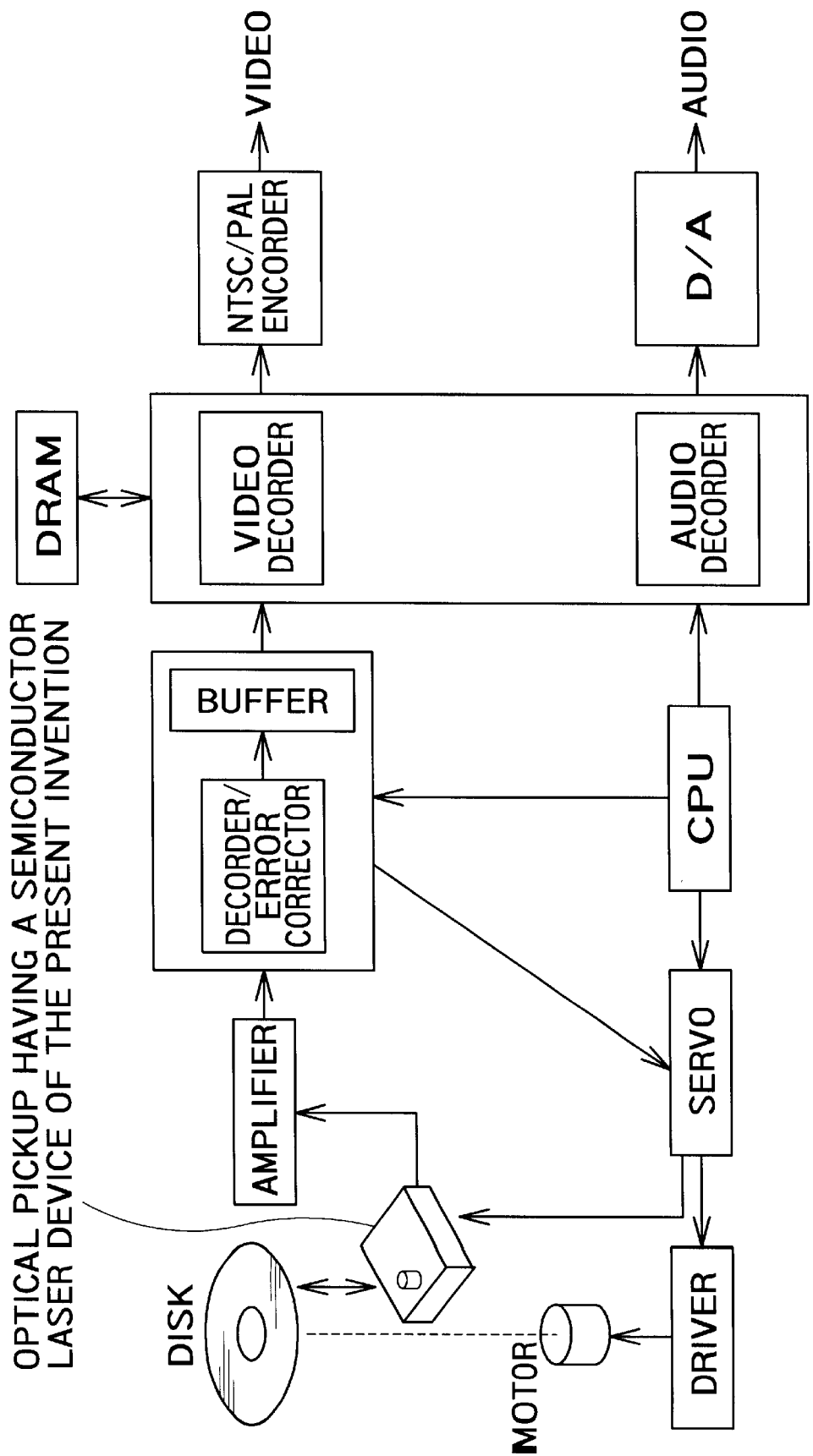
FIG. 6 is a block diagram of a DVD system, to which a semiconductor laser device of the present invention is applied.

FIG. 6 is a block diagram of a DVD system, to which a semiconductor laser device of the present invention is applied. An optical disc rotates at a predetermined speed of rotation by means of a driver. An optical pickup moves to a predetermined position by means of a servo. A signal recorded on the disc is detected by the optical pickup. Then, the detected signal is demodulated in accordance with the decode standard, and error correction is applied thereto. Then, image and voice are separated. The image passes thorough an MPEG2 video audio processing part, which carries out the processes such as the demodulation algorithm of the image of the MPEG2 and the demodulation of audio (AC-3 or MPEG), tobe encoded to an NTSC/PAL to be outputted. The audio is outputted via a D/A converter. Since the image is outputted at a variable rate, a buffer memory serves to absorb the image. The whole system is controlled by means of a CPU which carries out system control, so as to function as a total system including the servo.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor laser device comprising:
   a GaAs substrate of a first conductive type;
   at least one $In_{0.5}(Ga_{1-x}Al_x)_{0.5}P$ cladding layer of the first conductive type, which is provided on a first principal plate of said GaAs substrate;

a plurality of well layers provided on said cladding layer of the first conductive type;

a plurality of $In_{0.5}(Ga_{1-y}Al_y)_{0.y}P$ barrier layers associated with said plurality of well layers for forming a multiple quantum well structure, each of said plurality of $In_{0.5}(Ga_{1-y}Al_y)_{0.5}P$ barrier layers being provided between adjacent well layers of said plurality of well layers;

at least one first $In_{0.5}(Ga_{1-y}Al_y)_{0.5}P$ guiding layer, which is provided between said cladding layer of the first conductive type and said multiple quantum well structure;

at least one $In_{0.5}(Ga_{1-x}Al_x)_{0.5}P$ cladding layer of a second conductive type, which is provided on said multiple quantum well structure, at least one second $In_{0.5}(Ga_{1-y}Al_y)_{0.5}P$ guiding layer, which is provided between said multiple quantum well and said cladding layer of the second conductive type;

wherein Al composition ratios of said cladding layers of the first and second conductive types are greater than Al composition ratios of said first and second guiding layers (x>y), wherein a compressive strain is introduced into said well layers, said multiple quantum well structure produces a light having a wavelength of 650±20 nm, and said well layers have a thickness of less than 6 nm, and wherein a tensile strain for compensating said compressive strain in said well layers is introduced into at least one of said first guiding layer, said second guiding layer and said barrier layers wherein at least one of said cladding layer of the first conductive type and said cladding layer of the second conductive type has a second cladding layer of an $In_{0.5}(Ga_{1-z}Al_z)_{0.5}P$ on a side near said multiple quantum well structure, and Al composition ratio of said second cladding layers is greater than Al composition ratios of said cladding layers of the first and second conductive types (z>x).

2. A semiconductor laser device comprising:

a GaAs substrate of a first conductive type;

at least one $In_{0.5}(Ga_{1-x}Al_x)_{0.5}P$ cladding layer of the first conductive type, which is provided on a first principal plate of said GaAs substrate;

a plurality of well layers provided on said cladding layer of the first conductive type;

a plurality of $In_{0.5}(Ga_{1-y}Al_y)_{0.y}P$ barrier layers associated with said plurality of well layers for forming a multiple quantum well structure, each of said plurality of $In_{0.5}(Ga_{1-y}Al_y)_{0.5}P$ barrier layers being provided between adjacent well layers of said plurality of well layers; and at least one $In_{0.5}(Ga_{1-x}Al_x)_{0.5}P$ cladding layer of a second conductive type, which is provided on said multiple quantum well structure, wherein a compressive strain is introduced into said well layers, said multiple quantum well structure produces a light having a wavelength of 650±20 nm, and said well layers have a thickness of less than 6 nm, wherein at least one of said cladding layer of the first conductive type and said cladding layer of the second conductive type has a second cladding layer of an $In_{0.5}(Ga_{1-z}Al_z)_{0.5}P$ on a side near said multiple quantum well structure, and Al composition ratio of said second cladding layers is greater than Al composition ratios of said cladding layers of the first and second conductive types (z>x).

3. A semiconductor laser device as set forth in claim 2, wherein said compressive strain introduced into said well layers is less than or equal to +1.7%.

4. A semiconductor laser device as set forth in claim 3, wherein said well layers are made of an $In_wGa_{1-w}P$ wherein w is greater than 0.5 and less than or equal to 0.67.

5. A semiconductor laser device as set forth in claim 4, Which further comprises:

a striped ridge portion of an $In_{0.5}(Ga_{1-y}Al_y)_{0.5}P$ cladding layer of the second conductive type, said striped ridge portion being provided on said cladding layer of the second conductive type;

current blocking layers, which are provided on said cladding layer of the second conductive type and which are arranged on both sides of said striped ridge portion;

an intermediate band gap layer provided on said striped ridge portion;

a contact layer of the second conductive type provided on said intermediate band gap layer;

a first electrode provided on said contact layer of the second conductive type; and a second electrode provided on a second principal plane of said GaAs substrate.

6. A DVD system comprising:

drive means for rotating an optical disc;

optical pickup means for reading data stored on the optical disc;

video signal generator means for outputting video signals based on the data read by the optical pickup means;

audio signal generator means for outputting audio signals based on the data read by the optical pickup means, wherein said optical pickup means includes a semiconductor laser device having:

a GaAs substrate of a first conductive type;

at least one $In_{0.5}(Ga_{1-x}Al_x)_{0.5}P$ cladding layer of the first conductive type, which is provided on a first principal plate of said GaAs substrate;

at least one first $In_{0.5}(Ga_{1-y}Al_y)_{0.5}P$ guiding layer, which is provided on said cladding layer of the first conductive type;

a plurality of well layers provided on said first guiding layer;

a plurality of $In_{0.5}(Ga_{1-y}Al_y)_{0.5}P$ barrier layers associated with said plurality of well layers for forming a multiple quantum well structure, each of said plurality of $In_{0.5}(Ga_{1-y}Al_y)_{0.5}P$ barrier layers being provided between adjacent well layers of said plurality of well layers;

at least one second $In_{0.5}(Ga_{1-y}Al_y)_{0.5}P$ guiding layer, which is provided on said multiple quantum well structure; and at least one $In_{0.5}(Ga_{1-x}Al_x)_{0.5}P$ cladding layer of a second conductive type, which is provided on said second guiding layer, wherein a compressive strain is introduced into said well layers, and Al composition ratios of said cladding layers of the first and second conductive types are greater than Al composition ratios of said first and second guiding layers (x>y), said multiple quantum well structure producing a light having a wavelength of 650±20 nm, and said well layers having a thickness of less than 6 nm, wherein a tensile strain for compensating said compressive strain in said well layers is introduced into at least one of said first guiding layer, said second guiding layer and said barrier layers, and wherein at least one of said cladding layer of the first conductive type and said cladding layer of the second conductive type has a second cladding layer of an $In_{0.5}(GA_{1-z}Al_z)_{0.5}P$ on a side near said multiple quantum well structure, and Al composition ratio of said second cladding layers is greater than Al composition ratios of said cladding layers of the first and second conductive types (z>x).

* * * * *